(12) United States Patent
Hsu et al.

(10) Patent No.: US 6,750,100 B2
(45) Date of Patent: Jun. 15, 2004

(54) NANO-METER MEMORY DEVICE AND METHOD OF MAKING THE SAME

(75) Inventors: Sheng Teng Hsu, Camas, WA (US); Tomoya Baba, Ikoma (JP); Tetsuya Ohnishi, Fukuyama (JP)

(73) Assignee: Sharp Laboratories of America, Inc., Camas, WA (US)

( * ) Notice: Subject to any disclaimer, the term of this patent is extended or adjusted under 35 U.S.C. 154(b) by 307 days.

(21) Appl. No.: 09/940,312

(22) Filed: Aug. 27, 2001

(65) Prior Publication Data

US 2003/0040156 A1 Feb. 27, 2003

(51) Int. Cl.$^7$ .......................................... H01L 21/8247
(52) U.S. Cl. ........................................ 438/257; 438/947
(58) Field of Search ................................ 438/257–267, 438/947

(56) References Cited

U.S. PATENT DOCUMENTS 6,355,528 B1 * 3/2002 Ishida et al. ................ 438/269

* cited by examiner

Primary Examiner—Richard A. Booth
(74) Attorney, Agent, or Firm—David C. Ripma; Matthew D. Rabdau (57) ABSTRACT

A method of forming a memory device includes preparing a substrate having predefined characteristics; forming a first layer set on the substrate, including: building a first forming layer, having first form segments, on the substrate; building placeholder sidewalls on the first form segments wherein the sidewalls have a thickness of between about one nm and 100 nm; building a second forming layer, having second form segments, on the substrate between the placeholder sidewalls; removing the placeholder sidewalls forming vacated areas; and building active devices in the vacated areas.

16 Claims, 8 Drawing Sheets

NANO-METER MEMORY DEVICE AND METHOD OF MAKING THE SAME

FIELD OF THE INVENTION

This invention relates to nonvolatile memory, and specifically to a method of manufacturing a nonvolatile memory device having a minimum feature size in the nano-meter range.

BACKGROUND OF THE INVENTION

Conventional flash memory EEPROMS are made using conventional lithography and etching processes. The minimum feature size is limited by the resolution of the lithography portion of the fabrication process, which is approximately 0.1 $\mu$m ($10^{-7}$ meters). E-beam lithography may able to define line width as narrow as 0.01 $\mu$m ($10^{-8}$ meters), however, the through put is very slow. A manufacturing process having the reliability and throughput of conventional lithography and etching with nearly the resolution of E-beam lithography is therefore desirable.

SUMMARY OF THE INVENTION

A method of forming a memory device includes preparing a substrate having predefined characteristics; forming a first layer set on the substrate, including: building a first forming layer, having first form segments, on the substrate; building placeholder sidewalls on the first form segments wherein the sidewalls have a thickness of between about one nm and 100 nm; building a second forming layer, having second form segments, on the substrate between the placeholder sidewalls; removing the placeholder sidewalls forming vacated areas; and building active devices in the vacated areas.

It is an object of the invention to provide a method of fabricating a ultra high-density nonvolatile memory circuit.

Another object of the invention is to provide integrated circuit fabrication having a feature size in the nano-meter range.

A further object of the invention is to provide integrated circuit devices which have low power consumption.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

This invention is intended for ultra high-density, nonvolatile memory circuits fabrication. The method of the invention is able to define line widths on the order of one nano-meter (nm) ($10^{-9}$ meters), and to provide a very high throughput. Devices constructed according to the method of the invention have very low power consumption because of their very small size. Although photolithography is limited to a minimum device size of approximately 0.1 $\mu$m, a combination of photolithography, CVD and selective etching will be shown to make an active device of nano-meter size.

Figure 1:
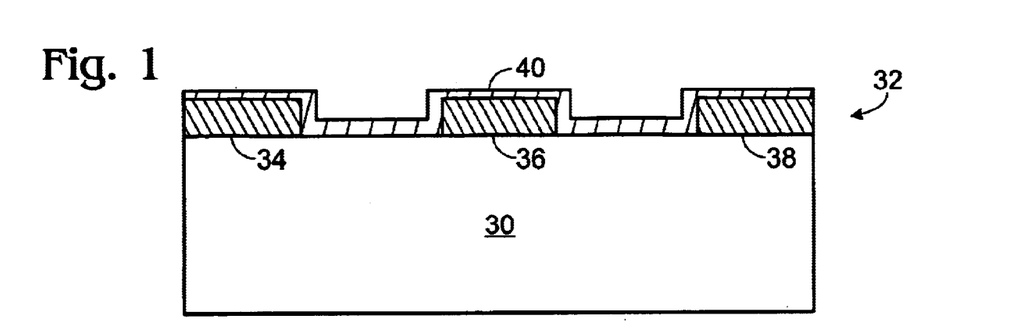
FIGS. 1–3 depict initial steps in a first embodiment of the method of the invention.

The structure of a device constructed according to the method of the invention may be understood with reference to the figures illustrating the steps of the fabrication process. Referring to FIG. 1, a substrate having a predefined characteristic, such as a p-type silicon substrate, 30 is used in the example of the first embodiment of the method of the invention, while a substrate having a predefined characteristic of a p+ substrate is used in the example of the second embodiment of the method of the invention. The surface of the wafer must be relatively highly conductive to provide device isolation, The doping density is on the order of between about $10^{18}$ cm$^{-3}$ and $10^{19}$ cm$^{-3}$. An oxide layer 32 is deposited on substrate 30, and is referred to herein as the first oxide layer, or first forming layer. The thickness of the first oxide layer may be between 100 nm to 1000 nm thick. Layer 32 and several subsequently formed layers comprise a first layer set. The wafer is covered with photoresist, and the first oxide layer is anisotropically etched to form oxide segments 34, 36 and 38, also referred to herein as first form segments, as the form segments function much as a form used in construction of concrete walls. A first nitride layer, or place holder layer, 40 is deposited by CVD, resulting in the structure depicted in FIG. 1. The thickness of the first nitride layer is equal to the width of the active device, therefore, the width of the active device may be from less than 1 nm to 100 nm ($1-10^{-9}$ m to $1-10^{-7}$ m).

Figure 2:
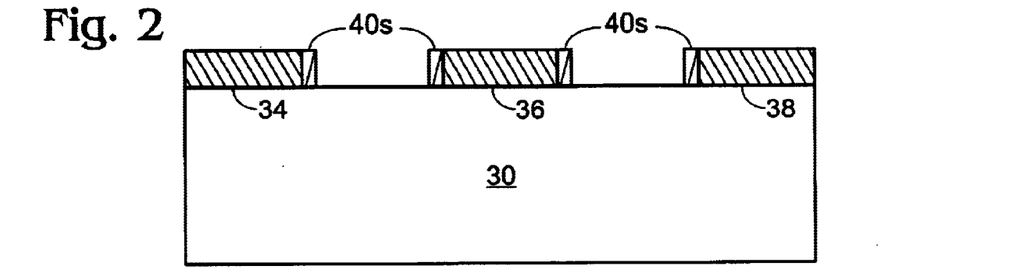

First nitride layer 40 is anisotropically etched, leaving a thin side wall layer, or placeholder segment, of nitride 40s covering the sidewall of oxide segments 34, 36 and 38 in FIG. 2. The thickness of the sidewall will determine the size of the active device. Thus, the size of an active device may be determined by the amount of placeholding nitride, or other suitable material, which is deposited over the first form segments.

Figure 3:
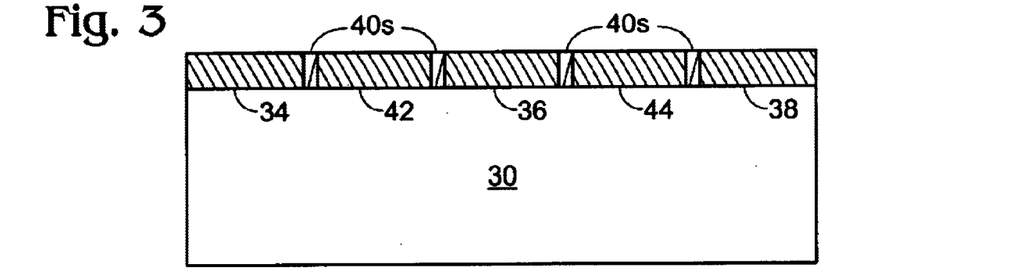

Referring next to FIG. 3, a second oxide layer is deposited by CVD, resulting in oxide segments 42, 44, also referred to herein as a second forming layer and second form segments, respectively. The thickness of the second oxide layer is thicker than the first oxide layer. The structure is planarized by CMP, which stops at the level of nitride sidewalls 40s.

Figure 4:
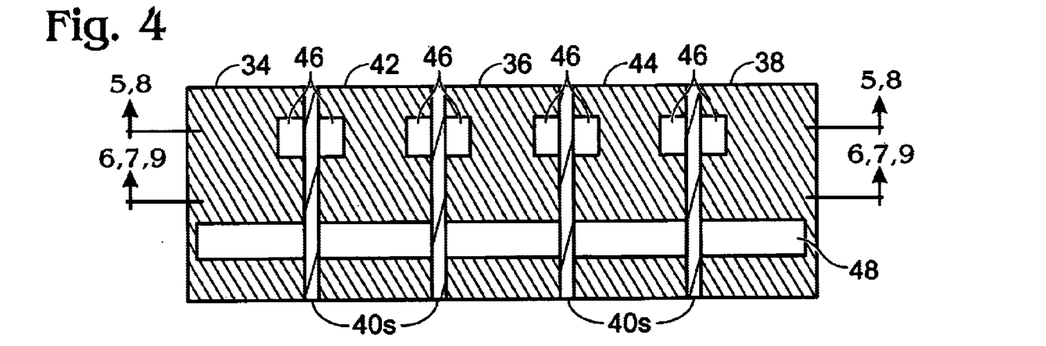
FIG. 4 is a top plan view of the structure, showing a first set of layers.
Figure 5:
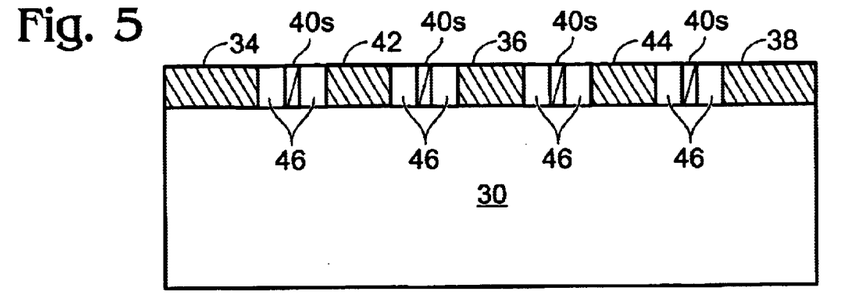
FIG. 5 is a cross section elevation taken along the line 5—5 of FIG. 4.

Referring now to FIGS. 4 and 5, where FIG. 4 is a top plan view of the structure, and FIG. 5 is a section elevation taken along line 5—5 of FIG. 4, photoresist is applied, and portions of the oxide form segments are etched to form contact areas, such as for bit line contacts 46 and ground contacts 48. The photo resist is then stripped, resulting in the structure of FIGS. 4 and 5.

Figure 6:
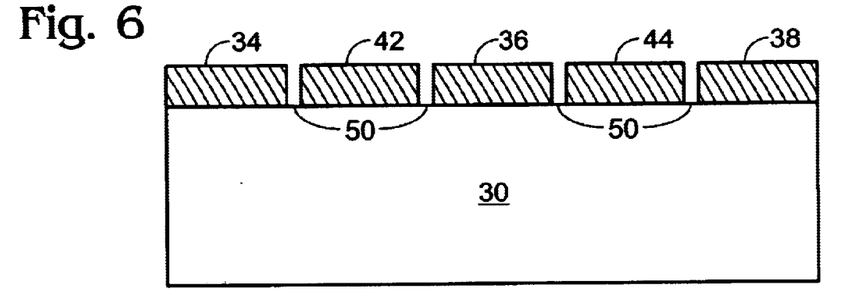
FIG. 6 is a cross section elevation taken along the line 6—6 of FIG. 4.

Referring to FIG. 6, which is a section elevation taken along line 6—6 of FIG. 4, photoresist is applied to cover any areas which will not ultimately contain a memory device. The remaining nitride sidewalls 40s are etched, by either a wet etch process or a dry etching process, to remove the placeholder segments and to form a microtrench 50 between contact areas 46 and 48. Microtrenches 50 have a width of between about one nm to 100 nm and a depth of between about 100 nm to 1000 nm.

Figure 7:
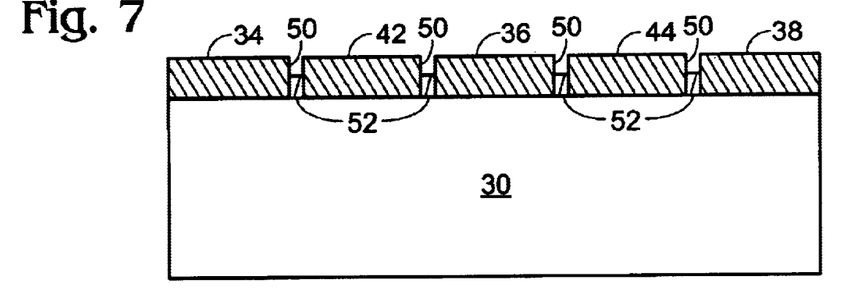
FIG. 7 is a cross section elevation taken along the line 7—7 of FIG. 4.
Figure 8:
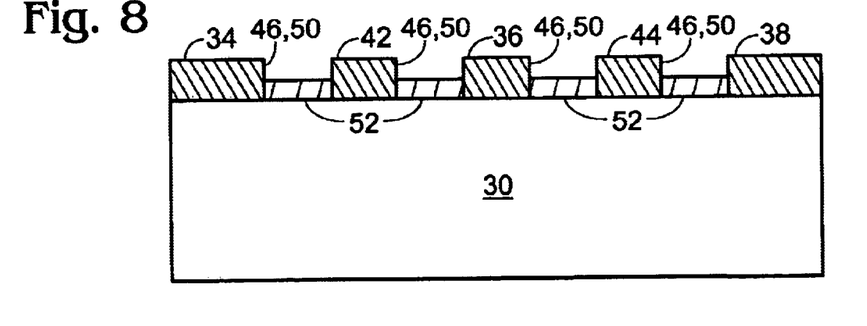
FIG. 8 is a cross section elevation taken along the line 8—8 of FIG. 4.

An active device is next built in the area now vacated by the placeholder segments. A layer of epitaxial silicon 52 is selectively grown in bit contact areas 46, ground contact areas 48, and trench 50, to be no deeper than the first oxide layer thickness (100 nm to 1000 nm), as shown in FIGS. 7 and 8.

Figure 9:
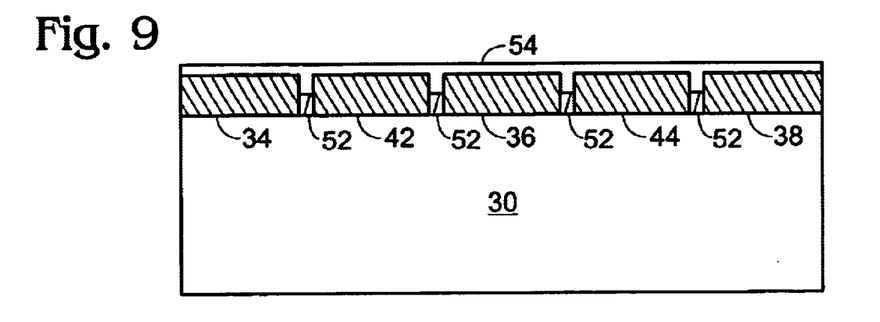
FIG. 9 is a cross section elevation taken along the line 9—9 of FIG. 4.

A layer of phosphosilicated glass (PSG), or phosphorous doped oxide, 54 is deposited by CVD such that layer 54 is thicker than the thickness of the first nitride layer (1 nm to 100 nm), as shown in FIG. 9. PSG layer 54 is the top layer of the first layer set.

A third oxide layer is formed as part of a second layer set, which also includes a second nitride placeholder layer which is etched similarly to that of the first nitride layer. A fourth oxide layer 58 is deposited finished by CMP to form a second micro-trench set perpendicular to the first microtrench set, as is shown by the top plan view of FIG. 10. FIG. 11 depicts a cross-section view along line 11—11 of FIG. 10.

Figure 10:
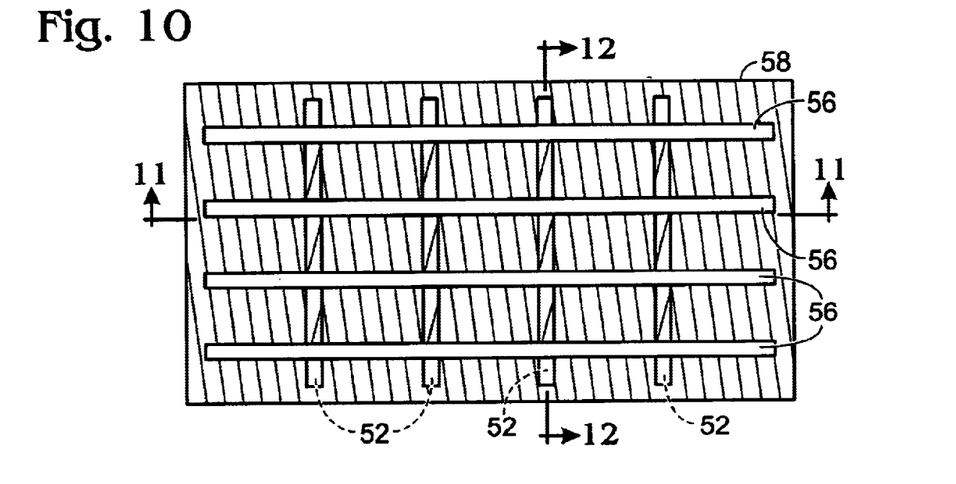
FIG. 10 is a top plan view of the structure, showing a second set of layers.
Figure 11:
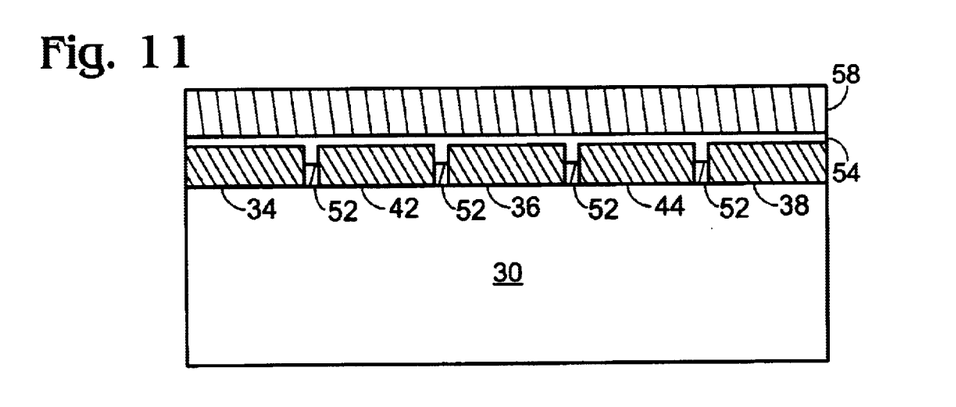
FIG. 11 is a cross section elevation taken along the line 11—11 of FIG. 10.
Figure 12:
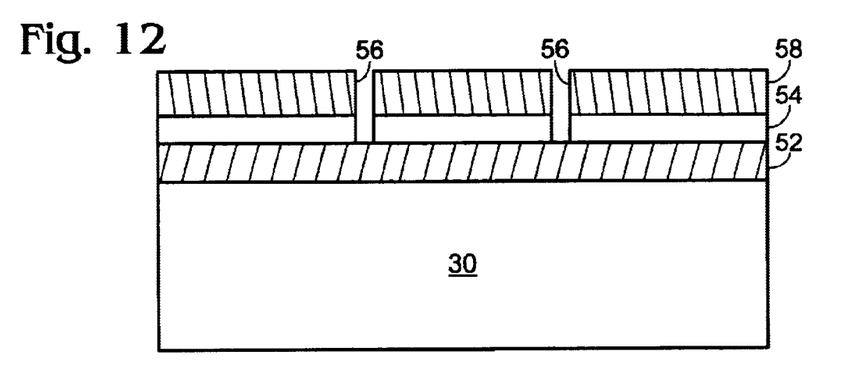
FIG. 12 is a cross section elevation taken along the line 12—12 of FIG. 10.

PSG layer 54 is plasma etched, resulting in the structure of FIG. 12, which is taken along the line 12—12 of FIG. 10, depicting a cross-section view along a bit line, wherein all of the epitaxial silicon layer is covered with PSG, except those portion of the PSG layer in active transistor areas, such as under second microtrenches 56.

Figure 13:
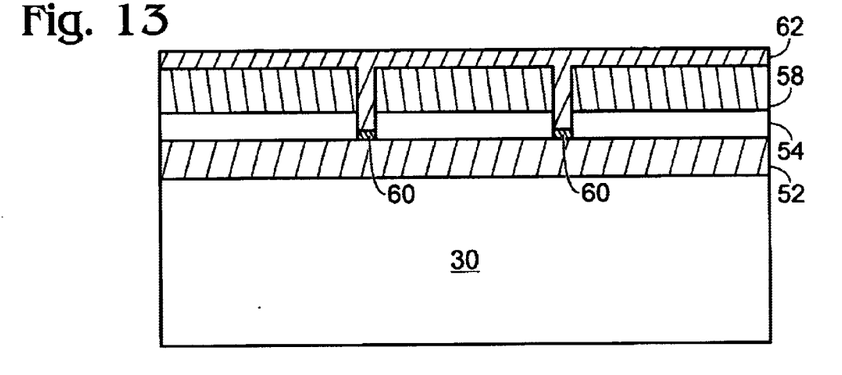
FIGS. 13–16 depict successive steps in the method of the invention.

Next, a tunnel oxide layer 60 is grown, after which, a first polysilicon layer 62 is formed by CVD. The thickness of first polysilicon layer 62 must be thicker than the thickness of the second nitride layer of the second layer set, as shown in FIG. 13.

Figure 14:
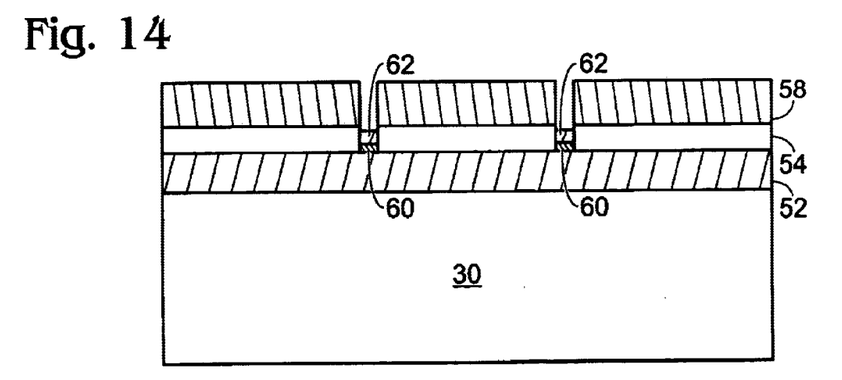

First polysilicon layer 62 is plasma etched, stopping at the level of PSG layer 54. All of the first polysilicon layer is removed except that which is located in an active channel region. However, first polysilicon layer 62 may be over etched so that the top of the first polysilicon layer is lower than the surface of PSG layer 54, as shown in FIG. 14.

Figure 15:
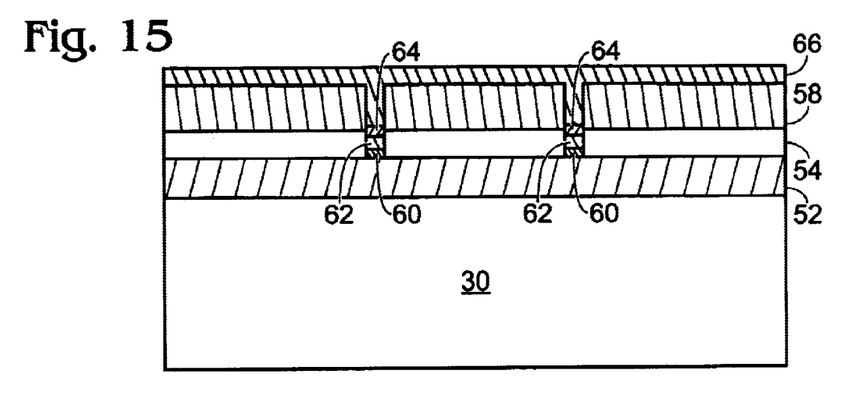

A layer 64 of polysilicon oxide is grown. A second polysilicon layer 66 is formed by CVD. Second polysilicon layer 66 has to be thicker than the thickness of the second nitride layer, as shown in FIG. 15.

Figure 16:
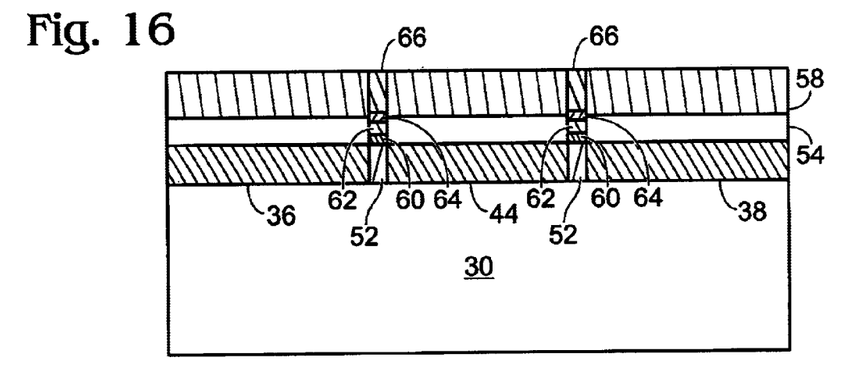

Second polysilicon layer 66 is plasma etched, or treated by CMP, stopping at the level of oxide layer 58. The resulting cross section is shown in FIG. 16. The nano-meter scaled second polysilicon layer serves as word line 66 in the finished structure, which has a width of between about one nm to 100 nm.

Figure 17:
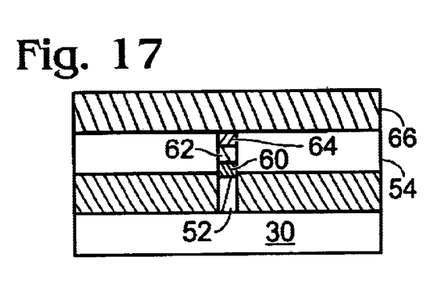
FIG. 17 is a cross section elevation taken along the line 17—17 of FIG. 16.
Figure 18:
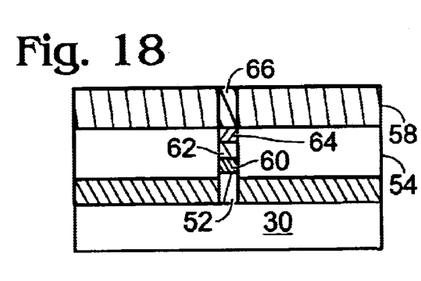
FIG. 18 is a cross section elevation taken along the line 18—18 of FIG. 16.

Phosphorus or arsenic ion implantation is performed to dope the second polysilicon layer to an n+ state. Second polysilicon layer 66 may be silicided, or a layer of metal deposited, and defined to enhance its conductivity. The structure is heated to diffuse and activate the implanted ion and at the same time cause phosphorus to diffuse from PSG layer 54 to dope the source/drain of an n+ transistor. A cross-sectional view of a memory cell along the word line is shown in FIG. 17, while a cross-sectional view of a memory cell along the bit line is shown in FIG. 18.

Figure 19:
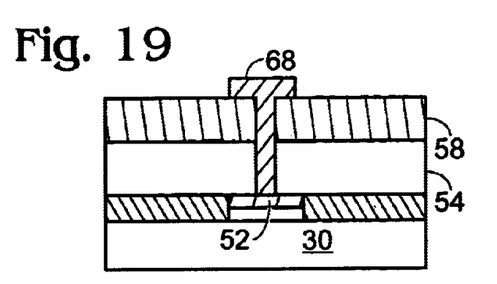
FIG. 19 is a cross section elevation taken at the contact area of the structure.

Following state-of-the-art process for oxide passivation, contact etching and metallization, a contact area for an electrode 68 is built, as shown in FIG. 19.

A thin layer of borosilcated glass (BSG), or boron doped oxide, may be deposited prior to the deposition of the first oxide layer. As etching of the first oxide layer also etches the BSG layer, there is no BSG located under the bit lines. The BSG layer serves as the diffusion source to dope the field region to be more P, which improves device isolation properties. Additional boron ions may be implanted in the selective epitaxial grown silicon nano-lines to adjust the threshold voltage of the memory transistor.

Enhanced Fabrication Process

A modified form of the method of the invention provides a very high density interconnect to the nano-meter memory device. The ground and the bit lines described previously herein are formed with conventional lithography method, and therefore require a relatively large contact area. This embodiment of the method of the invention demonstrates formation of ground and bit lines using the nano-meter line method of the invention.

Following the first embodiment, the first nano-trench is formed, epitaxial silicon is grown, and a PSG layer is deposited.

Figure 20:
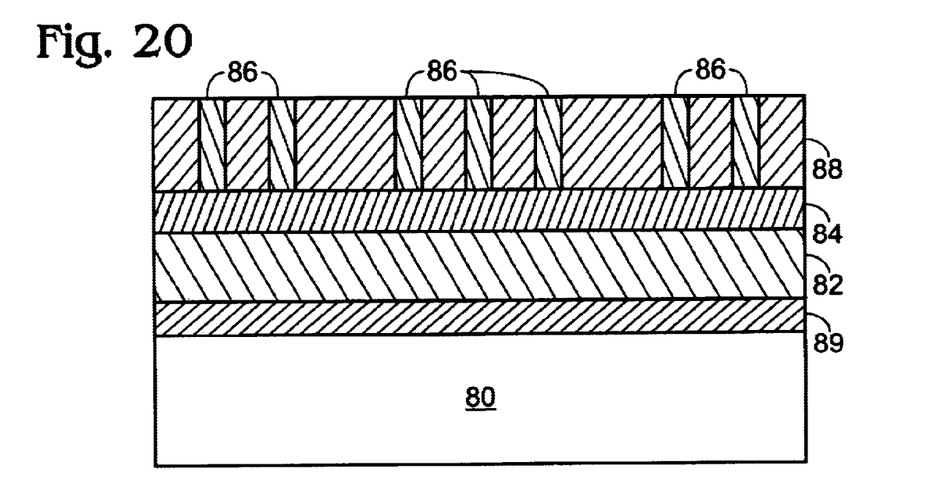
FIGS. 20–25 depicts successive steps in a second embodiment of the method of the invention.

The second nano-trench includes word lines and ground lines, as is shown in FIG. 20, which depicts a P+ silicon substrate 80, an epitaxial silicon layer 82, a PSG word line 84, a nitride layer 86 and an oxide layer 88. A p+ layer 89 is formed under epitaxial silicon layer 82 by boron ion implantation prior to formation of the first nano-trench.

Figure 21:
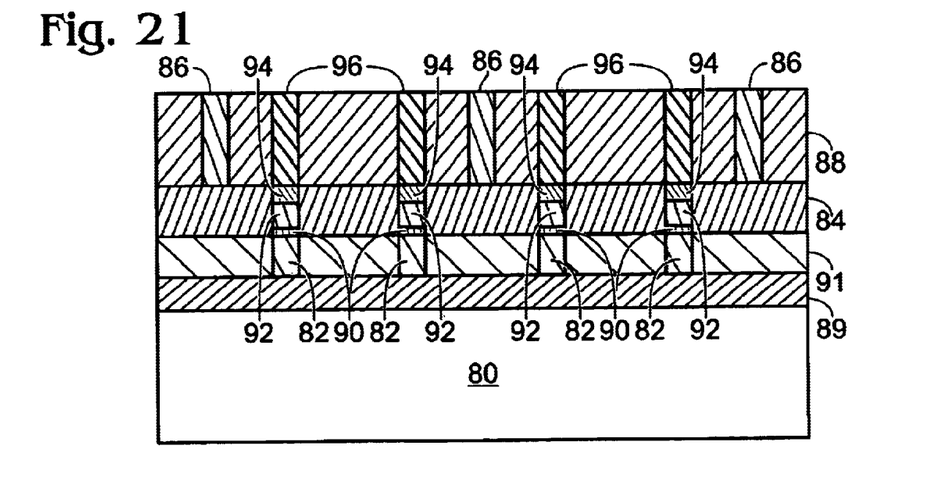

Prior etching of the nitride layer, all ground lines are cover with photoresist, and the nitride and the word lines are etched, forming memory transistors, which includes growing a tunnel oxide layer 90, forming an n+ layer 91, depositing a polysilicon layer 92, etching polysilicon layer 92 to form floating gates, growing a polysilicon oxide layer 94 and depositing a second polysilicon layer 96. Arsenic ions are implanted, at a dose of about $1-10^{15}$ cm$^{-2}$ to $5-10^{15}$ cm$^{-2}$, and at an energy level of 30 keV to 60 keV. The structure is smoothed by CMP, resulting in the structure shown in FIG. 21.

Figure 22:
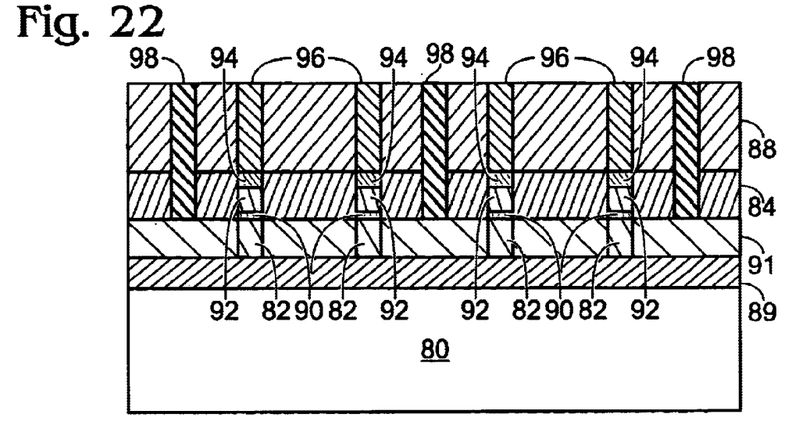

The second polysilicon layer is the control gate and is also used as word lines. The wafer is then annealed to activate the implanted ions and to provide proper diffusion of the ions. The nitride of the ground lines is etched, as is the PSG under the ground lines to the level of the first polysilicon layer. A first metal 98 is deposited by CVD and smoothed by CMP to form the ground lines, as shown in FIG. 22.

Figure 23:
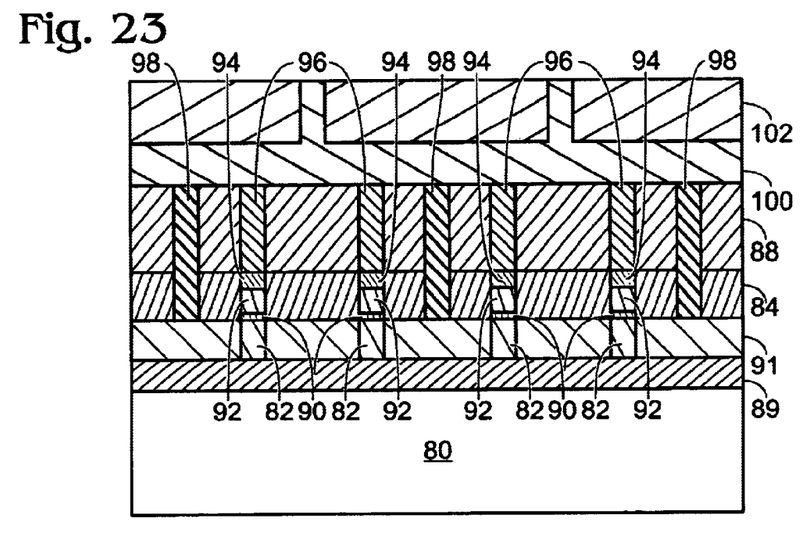

A layer of inter-metal oxide 100 is deposited by CVD. Formation of the third nanometer trench set for bit line contact follows etching of inter-metal oxide and is fabricated using a nitride layer 102 and oxide sidewalls, as is shown in FIG. 23.

Figure 24:
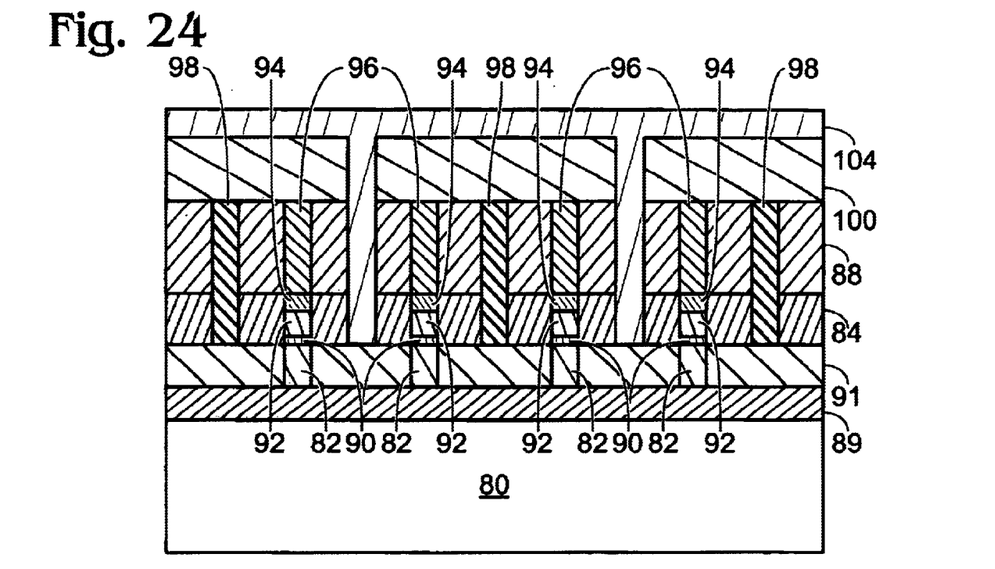
Figure 25:
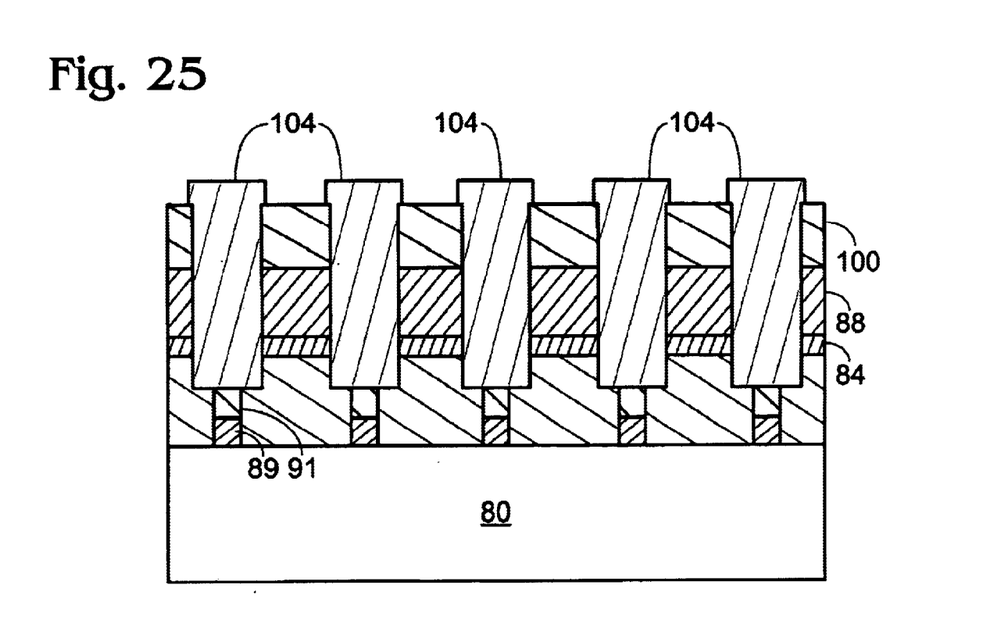

A thin layer of photoresist is applied to allow selective etching of the oxide nanometer trenches. The etching of the oxide layer continues through the PSG layer to form bit line contact. The nitride is then removed. A second metal layer 104 is deposited by CVD, selectively covered with photoresist, and etched to form bit lines. The cross-section along the bit line is shown in FIG. 24. FIG. 25 is a cross-sectional view of the memory array across the bit lines at the bit contact.

Thus, a method for fabricating integrated circuit features in the nano-meter size range has been disclosed. It will be appreciated that further variations and modifications thereof may be made within the scope of the invention as defined in the appended claims.

We claim:

1. A method of forming a memory device comprising:
   preparing a substrate having predefined characteristics;
   forming a first layer set on the substrate, including:
      building a first forming layer, having first form segments, on the substrate;
      building placeholder sidewalls on the first form segments;
      building a second forming layer, having second form segments, on the substrate between the placeholder sidewalls;
      removing only the placeholder sidewalls forming vacated areas; and
      building active devices in the vacated areas.

2. The method of claim 1 wherein said building placeholder sidewalls includes depositing a layer of nitride to a thickness of between about one run and 100 nm.

3. The method of claim 1 wherein said building a first forming layer includes forming a layer of silicon oxide to a thickness of between about 100 nm to 1000 nm.

4. The method of claim 1 wherein said building a second forming layer includes forming a layer of silicon oxide to a thickness of between about 100 nm to 1000 nm.

5. The method of claim 1 wherein said forming vacated areas includes forming plural, substantially parallel vacated areas in the first layer set.

6. The method of claim 5 which includes forming a second layer set, having the same components of the first layer set, having plural vacated areas therein on the first layer set, wherein the vacated areas of the second layer set are substantially normal to the vacated areas of the first layer set, and wherein active device are built at the intersection of the vacated areas in the first layer set and the vacated areas in the second layer set.

7. The method of claim 6 which includes forming word lines in the vacated areas of the first layer set.

8. The method of claim 1 which includes forming a doped oxide layer on the substrate before building the first forming layer.

9. The method of claim 8 wherein said forming a doped oxide layer includes forming a borosilicated glass layer on the substrate.

10. A method of forming a memory device comprising:
    preparing a substrate having predefined characteristics;
    building first form segments on the substrate to form one wall of regions which will be used for active device construction, word lines, bit lines and ground lines;
    depositing placeholder sidewalls to a thickness of between about one nm and 100 nm on the first form segments;
    building second form segments on the substrate between the placeholder sidewalls to form a spaced apart other wall of regions for active device construction, word lines, bit lines and ground lines;
    removing only the placeholder sidewalls forming vacated regions; and
    building active devices, word lines, bit lines and ground lines in the vacated regions.

11. The method of claim 10 wherein said building the first form segments includes forming a layer of silicon oxide to a thickness of between about 100 nm to 1000 nm.

12. The method of claim 10 wherein said building the first form segments includes forming a layer of silicon oxide to a thickness of between about 100 nm to 1000 nm.

13. The method of claim 10 wherein said forming vacated regions includes forming plural, substantially parallel vacated areas.

14. The method of claim 10 which includes forming a doped oxide layer on the substrate before building the first forming layer.

15. The method of claim 14 wherein said forming a doped oxide layer includes forming a borosilicated glass layer on the substrate.

16. A method of forming a memory device comprising:
    preparing a silicon substrate;
    forming a first layer set on the substrate, comprising:
       depositing a first oxide layer and etching the first oxide layer to form first oxide segments;
       depositing a first nitride layer to a thickness of between about one nm and 100 nm and etching the nitride layer to form nitride sidewalls about the oxide segments;
       depositing a second oxide layer to form second oxide segments between the nitride sidewalls of the first oxide segments;
       forming contact area in the first and second oxide layers, including forming bit contact areas and ground contact areas;
       etching the nitride sidewalls to form microtrenches which extend between bit contact areas and ground contact areas;
       depositing a layer of epitaxial silicon; and
       depositing a layer of PSG;
    forming a second layer set, comprising:
       depositing a third oxide layer and etching the third oxide layer to form third oxide segments;
       depositing a second nitride layer to a thickness of between about one nm and 100 nm and etching the nitride layer to form nitride sidewalls about the third oxide segments which sidewalls are substantially normal to the nitride sidewalls formed by the first nitride layer;
       depositing a fourth oxide layer to form fourth oxide segments between the nitride sidewalls of the third oxide segments;
       etching the second nitride sidewalls to form microtrenches;
    selectively etching the layers to the level of the PSG layer to form trenches;
    depositing a tunnel oxide layer in the trenches;
    depositing a first polysilicon layer and selectively etching the first polysilicon layer to the level of the PSG;
    depositing a polysilicon oxide layer;
    depositing a second polysilicon layer and plasma etching the second polysilicon layer to form word lines; and
    implanting impurities, annealing, and metallizing the device.

* * * * *